(12) United States Patent
Lee (10) Patent No.: US 8,915,212 B2
(45) Date of Patent: Dec. 23, 2014

(54) MASK FRAME ASSEMBLY FOR THIN FILM DEPOSITION

(75) Inventor: Sang-Shin Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 298 days.

(21) Appl. No.: 13/234,289

(22) Filed: Sep. 16, 2011

(65) Prior Publication Data

US 2012/0174862 A1    Jul. 12, 2012

(30) Foreign Application Priority Data

Jan. 11, 2011   (KR) ........................ 10-2011-0002879

(51) Int. Cl.
| | | |
|---|---|---|
| *B05C 11/00* | (2006.01) | |
| *H01L 51/56* | (2006.01) | |
| *C23C 14/04* | (2006.01) | |
| *C23C 14/12* | (2006.01) | |
| *H01L 51/00* | (2006.01) | |
| *B05C 21/00* | (2006.01) | |
| *B05B 15/04* | (2006.01) | |
| *C23C 16/04* | (2006.01) | |

(52) U.S. Cl.
CPC .............. *C23C 14/042* (2013.01); *C23C 14/12* (2013.01); *H01L 51/0011* (2013.01); *B05B 15/045* (2013.01); *C23C 16/042* (2013.01); *B05C 21/005* (2013.01)
USPC ........... 118/504; 118/505; 118/720; 118/721; 427/282

(58) Field of Classification Search
CPC .. C23C 14/042; C23C 16/042; H01L 51/011; B05C 21/005
USPC .................. 118/504, 505, 720, 721; 427/282
See application file for complete search history.

(56) References Cited

U.S. PATENT DOCUMENTS

| | | | |
|---|---|---|---|
| 6,955,726 B2 | 10/2005 | Kang et al. | |
| 2003/0221614 A1* | 12/2003 | Kang et al. | ..................... 118/504 |
| 2009/0137180 A1 | 5/2009 | Sung et al. | |
| 2010/0224125 A1* | 9/2010 | Lee et al. | ...................... 118/504 |

FOREIGN PATENT DOCUMENTS

| | | | | |
|---|---|---|---|---|
| JP | 2005171290 A | * | 6/2005 | |
| JP | 2005-350712 A | | 12/2005 | |
| JP | 2009041054 A | * | 2/2009 | |
| JP | 2010135269 A | * | 6/2010 | |
| KR | 2003-0093959 A | | 12/2003 | |
| KR | 10-2006-0102838 A | | 9/2006 | |
| KR | 1020060102838 | * | 9/2006 | |
| KR | 1020060114602 A | * | 11/2006 | |
| KR | 10-2009-0053418 A | | 5/2009 | |

* cited by examiner

*Primary Examiner* — Dah-Wei D Yuan
*Assistant Examiner* — Binu Thomas
(74) *Attorney, Agent, or Firm* — Robert E. Bushnell, Esq.

(57) ABSTRACT

A mask frame assembly includes an air tunnel between a frame and a mask so as to allow flow of air. Therefore, evaporation of cleaning liquid can be facilitated in gaps between the frame and the mask during cleaning and drying processes performed so as to reuse the mask frame assembly sooner. Thus, the amount of remaining cleaning liquid can be reduced so as to reduce the time necessary for preparation of a subsequent process using the mask frame assembly.

11 Claims, 7 Drawing Sheets

MASK FRAME ASSEMBLY FOR THIN FILM DEPOSITION

CLAIM OF PRIORITY

This application makes reference to, incorporates the same herein, and claims all benefits accruing under 35 U.S.C. §119 from an application earlier filed in the Korean Intellectual Property Office on the 11$^{th}$ of January 2011 and there duly assigned Serial No. 10-2011-0002879.

BACKGROUND OF THE INVENTION

1. Field of the Invention

The present invention generally relates to a mask frame assembly for depositing a thin film, and more particularly, to a mask frame assembly configured to facilitate evaporation of cleaning liquid used in a cleaning process.

2. Description of the Related Art

Organic light-emitting diode displays have wide viewing angles, good contrast, and quick response times.

In organic light-emitting diode displays, colors are displayed by using light generated as holes and electrons injected through an anode and a cathode recombine in a light-emitting layer. For this purpose, organic light-emitting diode displays have a stacked structure in which a light-emitting layer is disposed between an anode and a cathode. To obtain high light emitting efficiency, intermediate layers such as an electron injection layer, an electron transport layer, an hole injection layer, and a hole transport layer may be selectively disposed between the electrodes and the light-emitting layer.

Electrodes, intermediate layers, and light-emitting layers of organic light-emitting diode displays can be formed by various methods, such as a deposition method. In a process of manufacturing an organic light-emitting diode display by using a deposition method, a mask having a pattern corresponding to a pattern of a thin film to be formed on a substrate is prepared, and a thin film deposited on the substrate is patterned using the mask. A single large mask, which is coupled to a frame and which includes a thin-film pattern corresponding to a pattern to be formed on the entire surface of a substrate, may be used, or a mask including a plurality of segment masks having a stick shape and attached to a frame may be used.

After the deposition process is performed using a mask, the mask is cleaned and dried for the next deposition process. That is, since a deposition material is attached to the mask during the deposition process, the assembly of the mask and a frame is cleaned using cleaning liquid and is dried by blowing air through an air knife, so that the assembly of the mask and the frame can be used in a subsequent process.

However, in the cleaning and drying processes, cleaning liquid does not readily dry in fine gaps between the mask and the frame. More specifically, since the mask frame assembly is formed by welding an end of the mask to the frame, cleaning liquid permeated in the fine gaps between the mask and the frame does not readily dry even though the drying process is performed using an air knife.

If the mask frame assembly in which cleaning liquid remains is used in a subsequent deposition process, the deposition process may not be precisely performed because of the remaining cleaning liquid. For example, if the mask frame assembly in which cleaning liquid remains is mounted in a deposition chamber, the vacuum degree of the deposition chamber may vary due to the remaining cleaning liquid, and thus deposition quality may deteriorate. For this reason, it may be necessary to wait a long time until the mask frame assembly is completely dried before performing a subsequent deposition process.

In this case, as a result of the delay in reusing the assembly, operation efficiency is lowered. Therefore, countermeasures are necessary.

SUMMARY OF THE INVENTION

The present invention generally relates to a mask frame assembly for depositing a thin film. In the mask frame assembly, the amount of cleaning liquid remaining between a mask and a frame can be reduced after cleaning and drying processes.

According to an aspect of the present invention, a mask frame assembly for depositing a thin film comprises: a frame; and a mask including a deposition pattern and fixed to the frame; wherein an air tunnel is formed in a connection part between the frame and the mask.

The air tunnel may be formed in a region of the mask which contacts the frame, or in a region of the frame which contacts the mask.

A plurality of air tunnels may be formed in regions of the mask and the frame which contact each other. In this case, the air tunnel formed in the mask may be aligned with the air tunnel formed in the frame so as to form the same space, or the air tunnel formed in the mask may not be aligned with the air tunnel formed in the frame so as to form separate spaces.

Air tunnels may be formed in the connection part.

If a surface of the mask is a horizontal plane, the air tunnel may be formed in a horizontal direction, a vertical direction, or an oblique direction.

An end of the air tunnel may be open, and the other end of the air tunnel may be closed.

The mask may be a single large mask coupled to the frame, or the mask may include a plurality of segment masks coupled to the frame.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will now be described more fully with reference to the accompanying drawings, in which exemplary embodiments of the present invention are shown.

Figure 1:
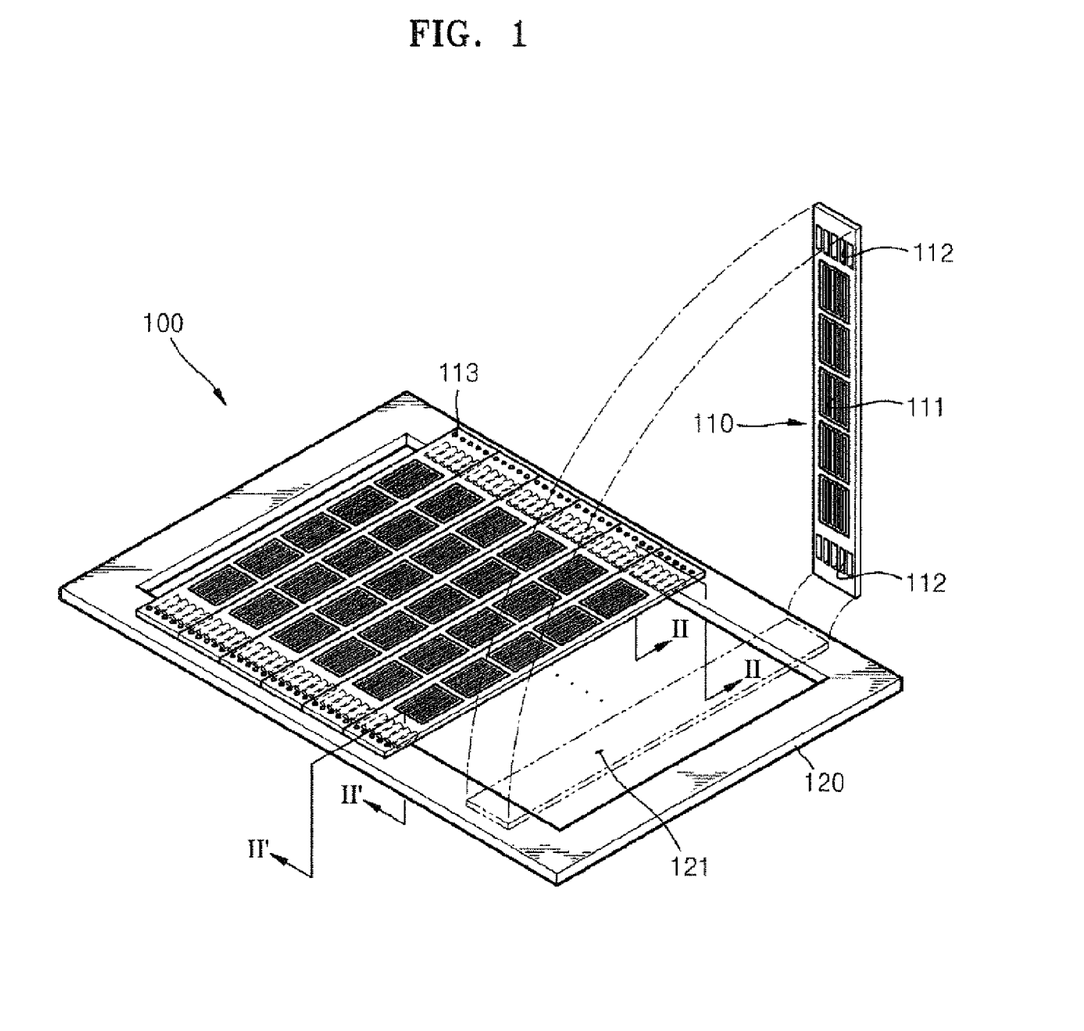
FIG. 1 is a perspective view illustrating a mask frame assembly according to an embodiment of the present invention.

FIG. 1 is a perspective view illustrating a mask frame assembly according to an embodiment of the present invention.

Referring to FIG. 1, the mask frame assembly 100 of the current embodiment includes a frame 120 and a plurality of segment masks 110. The frame 120 includes an opening 121, and both ends of the segment masks 110 are fixed to the frame 120.

The frame 120 of the mask frame assembly 100 has a rectangular shape, and the opening 121 is formed through the center of the frame 120. Both ends of the segment masks 110 are fixed to a pair of mutually-facing sides of the frame 120 by welding. Reference numeral 113 denotes welded points between the segment masks 110 and the frame 120.

The segment masks 110 have a long stick shape, and deposition patterns 111 are formed on regions of the segment masks 110 superimposed on the inside of the opening 121. As described above, both ends of the segment masks 110 are welded to the frame 120. The segment masks 110 may be formed of a material such as nickel, a nickel alloy, and a nickel-cobalt alloy.

Air tunnels 112 are formed in both ends of the segment masks 110 so that air can flow through the air tunnels 112. That is, the air tunnels 112 are formed through parts of the segment masks 110 fixed to the frame 120 by a method such as etching so that air can flow through the air tunnels 112. Although cleaning liquid may permeate between the segment masks 110 and the frame 120 during a cleaning process, the cleaning liquid easily evaporates due to air flowing through the air tunnels 112. In other words, although cleaning liquid may permeate between the segment masks 110 and the frame 120 by capillary action of the cleaning liquid in fine gaps between the segment masks 110 and the frame 120, the cleaning liquid easily evaporates from the fine gaps due to air flowing through the air tunnels 112 in the drying process.

Figure 2A:
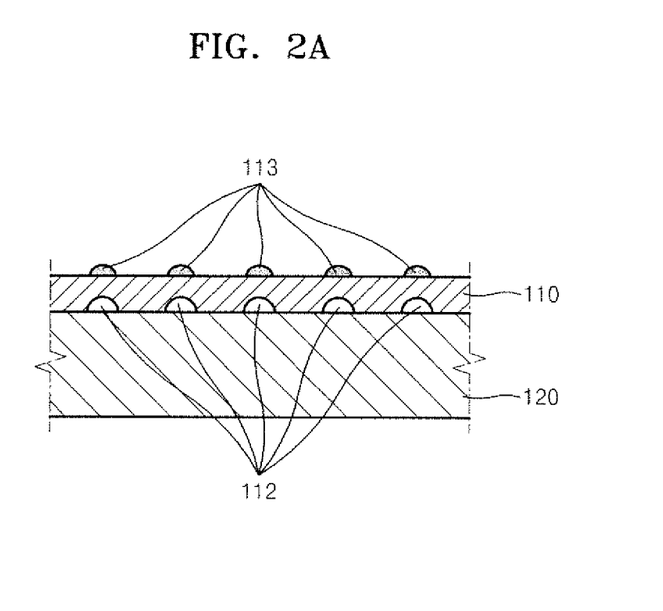
FIG. 2A is a sectional view taken along line II-II of FIG. 1.
Figure 2B:
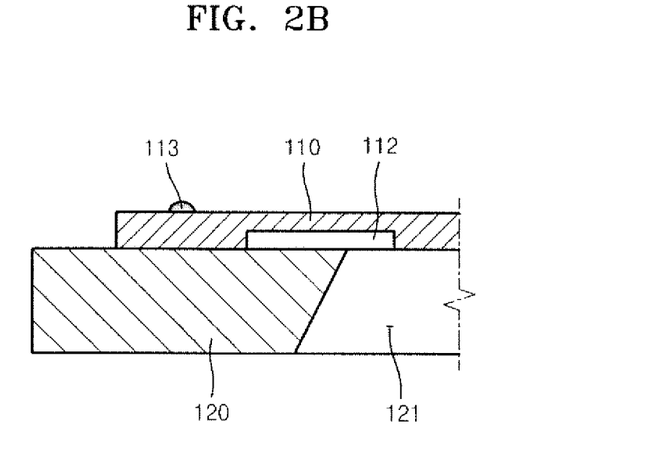
FIG. 2B is a sectional view taken along line II'-II' of FIG. 1.

For this purpose, as shown in FIGS. 2A and 2B, the air tunnels 112 may be formed in surfaces of the segment masks 110 which contact the frame 120 through an etching process.

FIG. 2A is a sectional view taken along line II-II of FIG. 1, and FIG. 2B is a sectional view taken along line II'-II' of FIG. 1.

Referring to FIGS. 2A and 2B, the air tunnels 112 may be formed through a half-etching process in the surfaces of the segment masks 110 which contact the frame 120 so as to facilitate evaporation of cleaning liquid permeating between the segment masks 110 and the frame 120. First ends of the air tunnels 112 are open so as to communicate with the opening 121, and second ends of the air tunnels 112 are closed. Alternatively, the second ends of the air tunnels 112 may be open to the outside. However, since the welded points 113 are close to the other ends of the air tunnels 112 (that is, welding is performed on regions close to the other ends of the air tunnels 112), if the other ends of the air tunnels 112 are open to the outside, the segment masks 110 may be weakly welded to the frame 120. Therefore, the air tunnels 112 may be open only to the opening 121.

Due to the above-described structure of the mask frame assembly 100, when cleaning and drying processes are performed after a thin film depositing process, cleaning liquid permeating between the segment masks 110 and the frame 120 may be rapidly dried. That is, since more areas of the fine gaps between the segment masks 110 and the frame 120 are exposed to air due to the air tunnels 112, in a drying process using air blown through an air knife or a natural drying process at room temperature, drying proceeds more rapidly as compared with the case of using a mask frame assembly of the prior art which does not include air tunnels.

Therefore, since drying is rapidly carried out, a subsequent process using the mask frame assembly 100 can be started sooner, and thus productivity is improved.

Figure 3:
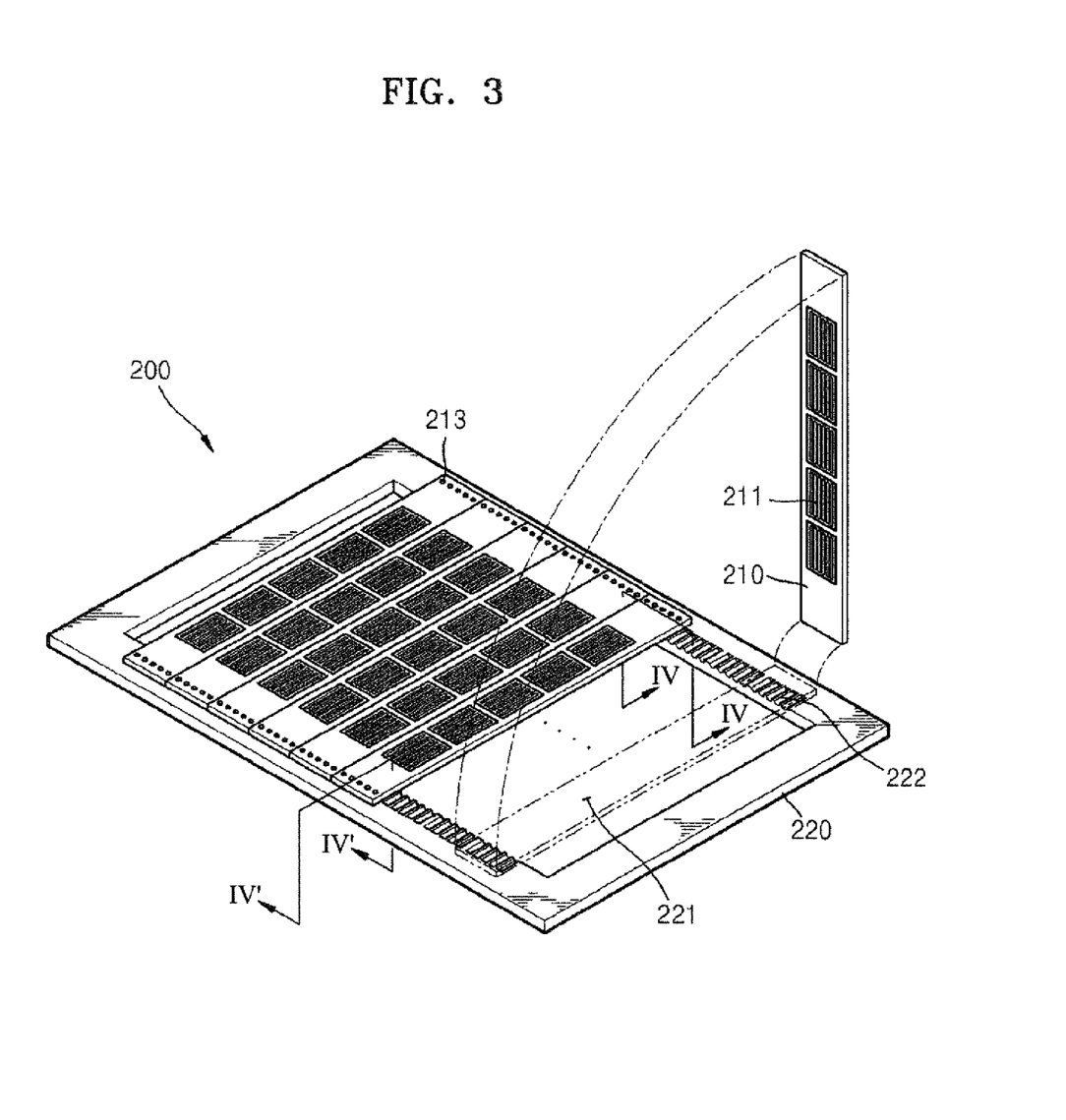
FIG. 3 is a perspective view illustrating a mask frame assembly according to another embodiment of the present invention.
Figure 4A:
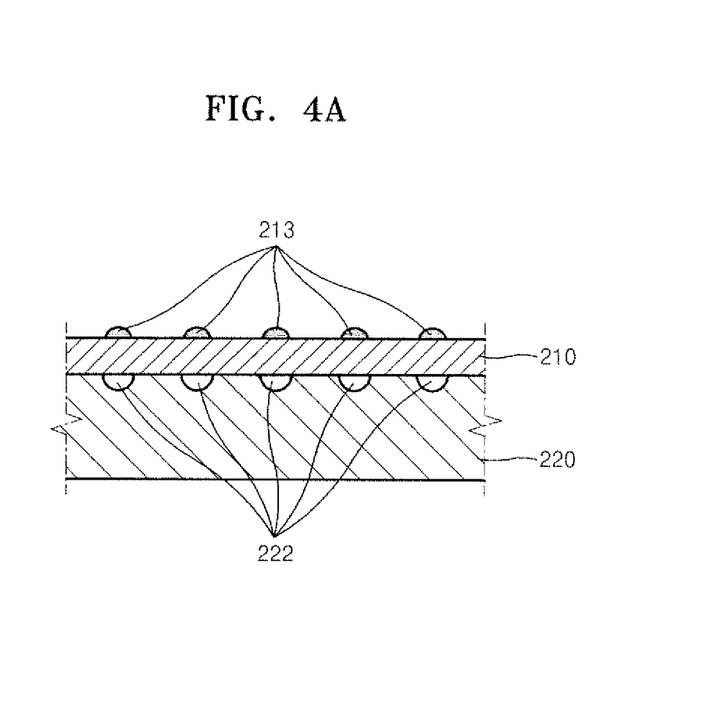
FIG. 4A is a sectional view taken along line IV-IV of FIG. 3.
Figure 4B:
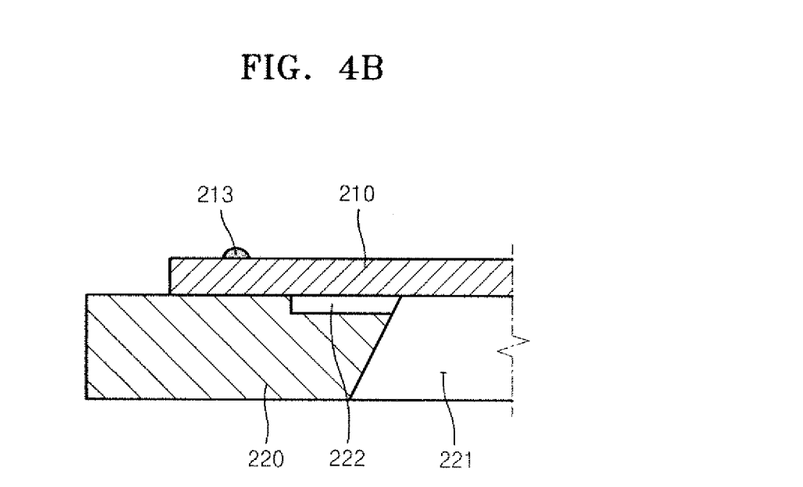
FIG. 4B is a sectional view taken along line IV'-IV' of FIG. 3.

FIG. 3 is a perspective view illustrating a mask frame assembly according to another embodiment of the present invention, FIG. 4A is a sectional view taken along line IV-IV of FIG. 3, and FIG. 4B is a sectional view taken along line IV'-IV' of FIG. 3.

Thus, FIGS. 3, 4A and 4B illustrate a mask frame assembly 200 according to another embodiment of the present invention.

The mask frame assembly 200 of the current embodiment includes a plurality of segment masks 210 and a frame 220. The segment masks 210 include deposition patterns 211 and are attached to the frame 220. Air tunnels 222 are formed to reduce the remaining amount of cleaning liquid after cleaning and drying processes are performed, that is, to facilitate evaporation of cleaning liquid after the cleaning and drying processes are performed. In the current embodiment, the air tunnels 222 are formed in the frame 220 instead of in the segment masks 210.

Referring to FIGS. 4A and 4B, the segment masks 210 have the same structure as that of masks of the previous embodiment, but the air tunnels 222 are formed in a top surface of the frame 220. That is, the air tunnels 222 are formed in a region of the frame 220 which contacts the segment masks 210. The air tunnels 222 are open only to an opening 221 of the frame 220. That is, ends of the air tunnels 222 close to welded points 213 are closed so as not to weaken attachment of the segment masks 210 to the frame 220.

Thus, the current embodiment is different from the previous embodiment in that the air tunnels 222 are formed in the frame 220 instead of in the segment masks 210. However, evaporation of cleaning liquid can be facilitated by the air tunnels 222, as in the previous embodiment.

Therefore, drying can be rapidly carried out, and thus it takes less time to prepare a subsequent process using the mask frame assembly 200. Thus, productivity is improved.

FIGS. 5 thru 8 are views illustrating modified examples of the mask frame assemblies illustrated in FIGS. 1 and 3 according to other embodiments of the present invention.

Figure 5:
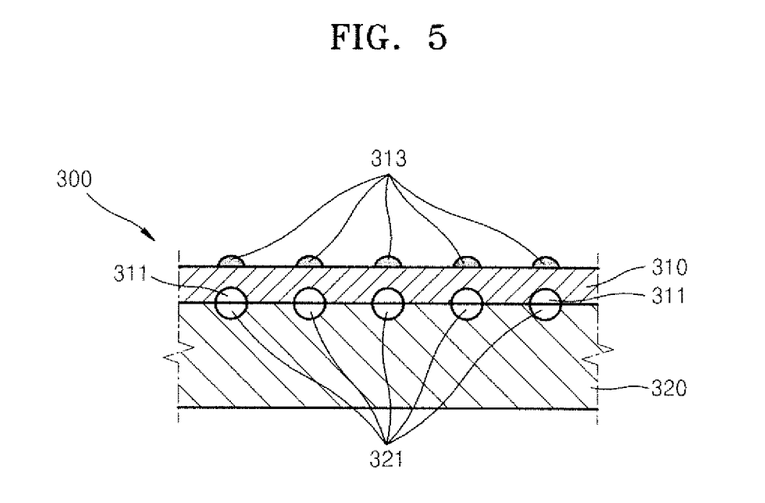
FIGS. 5 thru 8 are views illustrating modified examples of the mask frame assemblies illustrated in FIGS. 1 and 3 according to other embodiments of the present invention.

FIG. 5 illustrates an exemplary mask frame assembly 300 in which air tunnels 311 and 321 are formed in segment masks 310 and a frame 320. The air tunnels 311 of the segment masks 310 are aligned with the air tunnels 321 of the frame 320 so as to form the same spaces. In FIG. 5, reference numeral 313 denotes welded points.

The current embodiment is different from the previous embodiments in that the air tunnels 311 and 321 are formed in both the segment masks 310 and the frame 320 instead of forming the air tunnels 311 and 321 only in the segment masks 310 or the frame 320, respectively. However, the same drying effect can be obtained by the current embodiment. That is, evaporation of cleaning liquid is facilitated in the current embodiment.

Figure 6:
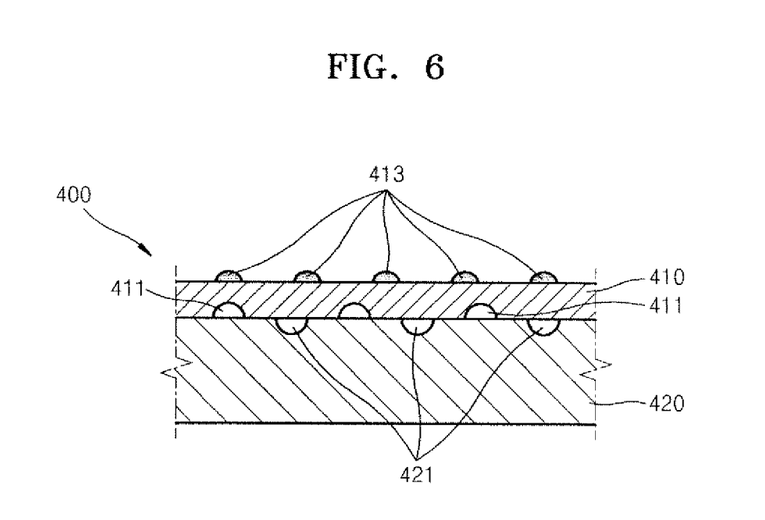

FIG. 6 illustrates an exemplary mask frame assembly 400 in which air tunnels 411 and 421 are formed in masks 410 and a frame 420, respectively, as in the embodiment shown in FIG. 5. However, in the current embodiment, the air tunnels 411 of the masks 410 are not aligned with the air tunnels 421 of the frame 420 so as to form separate spaces. That is, the air tunnels 411 and 421 are alternately arranged. In FIG. 6, reference numeral 413 denotes welded points 413.

The same drying effect can be obtained in the current embodiment. That is, evaporation of cleaning liquid is facilitated due to the air tunnels 411 and 421.

Figure 7:
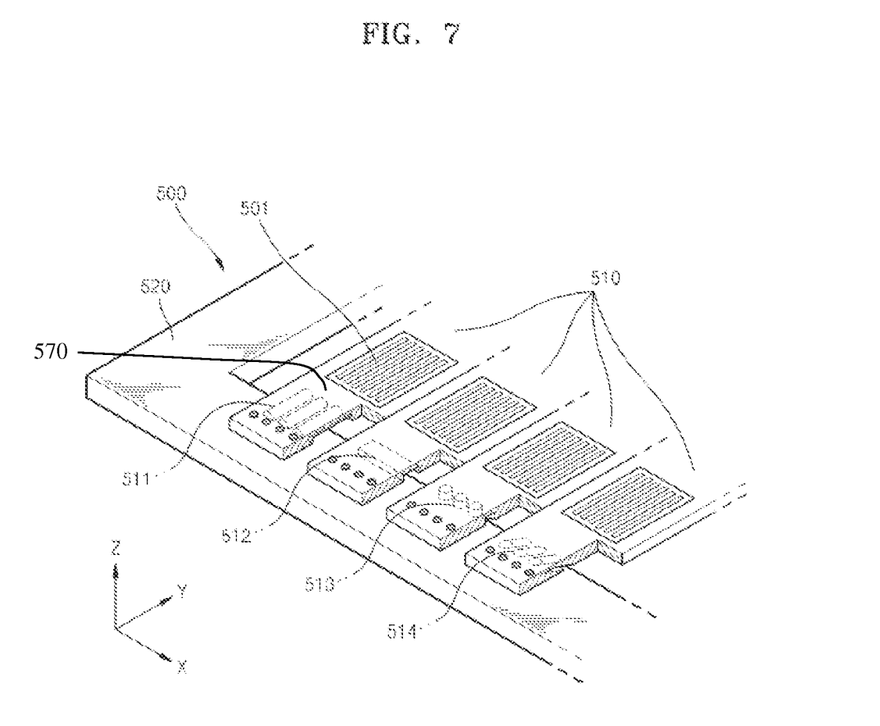

FIG. 7 illustrates an exemplary mask frame assembly 500 in which air tunnels 511, 512, 513 and 514 are formed in various directions. Segment masks 510, each having deposition patterns 501, are welded to a frame 520, and the air tunnels 511, 512, 513 and 514 are formed in connection parts between the segment masks 510 and the frame 520. The air tunnels 511 and 512 are horizontally formed in parallel with a major surface 570 of the segment masks 510 (X-Y plane), and the air tunnels 513 are formed in a direction (Z-axis direction) perpendicular to the X-Y plane. The air tunnels 514 are formed in an oblique direction making an angle with the X-Y plane. That is, the air tunnels 511, 512, 513 and 514 have various directions. Although the air tunnels 511, 512, 513 and 514 have various directions, since air can flow smoothly in the air tunnels 511, 512, 513 and 514, substantially the same effect as embodiments described above is obtained, that is, evaporation of cleaning liquid is facilitated. Instead of, or in addition to, the air tunnels 511, 512, 513 and 514 formed in the segment masks 510, air tunnels may be formed in the frame 520.

As described above, the same effect is obtained in the current embodiment as in the embodiments described above. That is, evaporation of cleaning liquid is facilitated by the air tunnels 511, 512, 513 and 514 having various directions.

Figure 8:
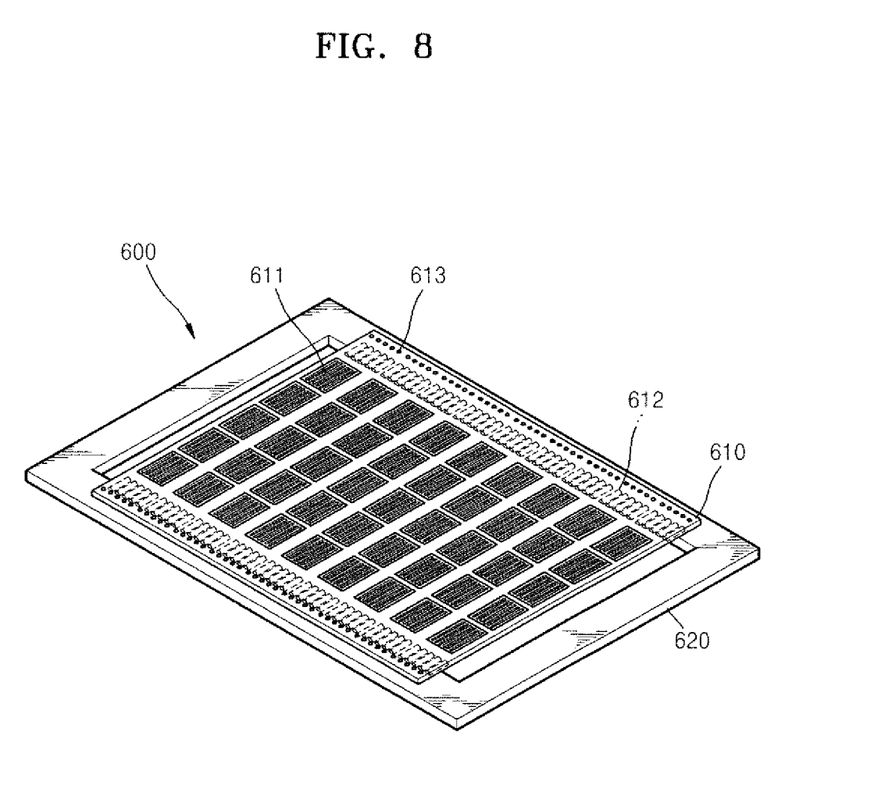

FIG. 8 illustrates an exemplary mask frame assembly 600 including a single large mask 610. In the previous embodiments, a plurality of segment masks are welded to a frame. However, in the current embodiment, the single large mask 610 is welded to a frame 620, as shown in FIG. 8. Even in this case, air tunnels 612 can be formed in the same way as described above. In FIG. 8, reference numeral 611 denotes deposition patterns, and reference numeral 613 denotes welded points.

In the current embodiment, the same effect as achieved by embodiments described above is obtained by the air tunnels 612 formed in the mask 610. That is, evaporation of cleaning liquid is facilitated by the air tunnels 612.

In addition to, or instead of, the air tunnels 612 formed in the mask 610, air tunnels may be formed in the frame 620.

The above-described mask frame assemblies may be used in various thin-film forming processes, such as a process of patterning an organic light-emitting film. In addition, since cleaning liquid can be rapidly dried in cleaning and drying processes, productivity is largely improved. Furthermore, the vacuum degree of a deposition chamber may be less affected by remaining cleaning liquid because the remaining cleaning liquid can be effectively dried, and thus deterioration of deposition quality can be prevented.

As described above, according to the mask frame assemblies of the embodiments of the present invention, evaporation of cleaning liquid is facilitated in regions between the masks and the frame so as to reduce the amount of cleaning liquid remaining after cleaning and drying processes are performed. Therefore, it will take less time to prepare a subsequent process using the mask frame assemblies. In addition, deterioration of deposition quality caused by vacuum degree variations in a deposition chamber can be prevented.

While the present invention has been particularly shown and described with reference to exemplary embodiments thereof, it will be understood by those of ordinary skill in the art that various changes in form and detail may be made therein without departing from the spirit and scope of the present invention, as defined by the following claims.

What is claimed is:

1. A mask frame assembly for depositing a thin film, comprising:
    a frame having a central void; and
    a mask supported by the frame, the mask comprising a connection part joined to a deposition pattern positioned inside the central void, a plurality of air tunnels formed in a junction which is between the connection part and the frame and by which the connection part and the frame contact each other, each air tunnel directly connected to only the central void of the frame.

2. The mask frame assembly of claim 1, wherein the air tunnels are formed in a region of the mask.

3. The mask frame assembly of claim 1, wherein the air tunnels are formed in a region of the frame.

4. The mask frame assembly of claim 1, wherein the plurality of air tunnels include a plurality of first air tunnels and a plurality of second air tunnels that are formed in regions of the mask and the frame, respectively.

5. The mask frame assembly of claim 4, wherein each first air tunnel formed in the mask is aligned with one of the second air tunnels formed in the frame so as to form a same space.

6. The mask frame assembly of claim 4, wherein the first air tunnels formed in the mask are not aligned with the second air tunnels formed in the frame so as to form separate spaces.

7. The mask frame assembly of claim 1, wherein the plurality of air tunnels that are separate from each other are formed on a same side of the central void, each of the plurality of air tunnels separately and directly connected to only the central void of the frame.

8. The mask frame assembly of claim 1, wherein the air tunnels are formed in one of a parallel direction and a perpendicular direction with respect to a major surface of the mask.

9. The mask frame assembly of claim 1, wherein an end of each air tunnel is open to the central void of the frame, and another end of the respective air tunnel is closed.

10. The mask frame assembly of claim 1, wherein the mask is a single large mask coupled to the frame.

11. The mask frame assembly of claim 1, wherein the mask comprises a plurality of segment masks coupled to the frame.

* * * * *